US006741867B1

(12) United States Patent
Tetsuya

(10) Patent No.: US 6,741,867 B1
(45) Date of Patent: May 25, 2004

(54) NON-LINEAR DISTORTION COMPENSATION CIRCUIT, TRANSMITTER DEVICE TO BE EMPLOYED IN THE SAME AND MOBILE COMMUNICATION UNIT

(75) Inventor: Takaki Tetsuya, Tokyo (JP)

(73) Assignee: NEC Corporation, Tokyo (JP)

( * ) Notice: Subject to any disclaimer, the term of this patent is extended or adjusted under 35 U.S.C. 154(b) by 582 days.

(21) Appl. No.: 09/714,433

(22) Filed: Nov. 17, 2000

(30) Foreign Application Priority Data

Nov. 30, 1999 (JP) .......................................... 11-338917

(51) Int. Cl.[7] ................................................ H04K 1/02
(52) U.S. Cl. ................. 455/522; 455/127.1; 455/127.2; 455/126; 455/114.3; 375/297; 375/296
(58) Field of Search ............................. 455/522, 127.1, 455/127.2, 126, 114.3; 375/296, 297; 370/320, 335, 342

(56) References Cited

U.S. PATENT DOCUMENTS

| 5,903,823 | A | | 5/1999 | Moriyama et al. | |
| 6,081,698 | A | | 6/2000 | Moriyama et al. | |
| 6,091,941 | A | | 7/2000 | Moriyama et al. | |
| 6,178,193 | B1 | | 1/2001 | Kondo | |
| 6,272,326 | B1 | * | 8/2001 | Shinde | 455/127.1 |
| 6,373,902 | B1 | * | 4/2002 | Park et al. | 375/296 |
| 6,563,883 | B1 | * | 5/2003 | Leinonen et al. | 375/295 |

FOREIGN PATENT DOCUMENTS

| JP | 9-153849 | 6/1997 |
| JP | 10-23095 | 1/1998 |
| JP | 10-98421 | 4/1998 |
| JP | 10-322137 | 12/1998 |
| JP | 11-4213 | 1/1999 |
| JP | 2000-24581 | 1/2000 |
| JP | 2000-111438 | 4/2000 |
| JP | 2000-270032 | 9/2000 |

* cited by examiner

Primary Examiner—Nay Maung
Assistant Examiner—Alan T. Gantt
(74) Attorney, Agent, or Firm—Foley & Lardner

(57) ABSTRACT

A non-linear distortion compensation circuit, a transmission equipment employing the same and a mobile transmission equipment may accurately compensate distortion caused by non-linearity of a transmitter per bit (symbol) even while the base station is performing transmission power control for the transmitter of the mobile station. The non-linear distortion compensation circuit in a transmission equipment controls a transmission power depending upon an external transmission power control information upon transmission of a digital signal. The non-linear compensation circuit has compensation component generating means for generating a compensation component for a non-linear distortion depending upon a transmission power per bit of the digital signal and the transmission power control information, and compensating means for compensating the non-linear distortion of the transmission signal by the compensation component.

24 Claims, 8 Drawing Sheets

NON-LINEAR DISTORTION COMPENSATION CIRCUIT, TRANSMITTER DEVICE TO BE EMPLOYED IN THE SAME AND MOBILE COMMUNICATION UNIT

BACKGROUND OF THE INVENTION

1. Field of the Invention

The present invention relates generally to a non-linear distortion compensation circuit, a transmitter device to be employed in the same and a mobile communication unit. More particularly, the invention relates to a control system for a non-linear distortion compensation circuit for compensating non-linear distortion to be caused by non-linearity of an amplifier or a frequency converter.

2. Description of the Related Art

In general, it has been known a linearizer as a non-linear distortion compensation circuit for compensating non-linear distortion caused by non-linearity of an amplifier, a frequency converter or the like forming a transmitter to be used in a radio communication. As the linearizer, one taking output only non-linear signal from a transmission signal transmitted and compensating non-linear distortion by subtracting the taken out non-linear distortion signal, or one preliminarily multiplying a signal having distortion compensating characteristics to a transmission signal before radio transmission process, such as frequency conversion, amplification and so forth with taking a non-linear distortion to be caused in the transmitter into account, for compensating distortion.

On the other hand, it has been known that non-linear distortion caused by non-linearity of the amplifier, frequency converter and so forth forming the transmitter to be used in radio communication appears as a leak current in a frequency band of a channel on transmission and in a frequency band of an adjacent channel of the channel on transmission and the leak current increases according to increasing of transmission power. Particularly, a power leaking to adjacent channel is known as an adjacent-channel leak power. The adjacent-channel leak power caused by the transmitter may affect for other radio equipment communicating using the adjacent channel to cause degradation of reception characteristics.

Next, discussion will be given for influence of adjacent-channel leak power caused by radio equipment employing a spread spectrum communication system (CDMA system: Code Division Multiple Access system) performing multiplex communication by spreading spectra of communication signals as a communication system employed in a mobile communication, for other communication system.

In the CDMA system, spreading of spectra of communication signals is performed employing a spreading code, such as pseudo noise code (PN code: Pseudo random Noise code), and communication signals are identified by the spreading code. Therefore, the CDMA system is characterized by capability of simultaneous communication of a plurality of radio equipments and a plurality of channels at the same frequency. The CDMA system is also characterized by the fact that, upon demodulating a received signal, demodulation of the received signal cannot be accomplished unless multiplying the same spreading code as that used in spreading on transmission side at the same timing as that in the transmission side, and the received signal spread by different spreading code or the received signal spread at different timing, namely the signals used for communication by other radio equipments or the signals of other channels are fallen as noise within a reception band currently on reception.

Here, consideration is given for the case where a base station of mobile communication is present, where a plurality of mobile stations are present in distal position and proximal position of the base station and where communication is performed by CDMA system. When the mobile stations at distal position and the proximal position of the base station are communicating with the base station using the same frequency and the same transmission power, as viewed at a receiving end of the base station, the transmission power of the mobile station communicating at the proximal position of the base station is higher than that of the mobile station communicating at the distal position to submerge the transmission signal of the mobile station at the distal position in the transmission signal of the mobile station at the proximal position. This has been known as a far-near problem. In view of the characteristics of the CDMA system, even when the base station demodulates the signal transmitted from the distal mobile station, the transmission signal of the distal mobile station cannot be demodulated correctly since the signal of the proximal mobile station falls with the reception band as noise.

In the CDMA system, the far-near problem is solved by performing transmission power control at high precision and high accuracy relatively frequently. Namely, by performing transmission power control, a transmission power of the proximal mobile station is controlled to be lower power and a transmission power of the distal mobile station is controlled to be higher power. For transmission at higher power by the mobile station, the frequency converter and/or the amplifier forming the transmitter of the mobile station has to be operated at non-linear region thereof. As a result, non-linear distortion of the transmission signal increases at higher level of the transmission power. Namely, the adjacent-channel leak power transmitted from the transmitter is increased. Influence of the adjacent-channel leak power to other system will be discussed with reference to FIG. 6.

FIG. 6 illustrates a mobile communication system including a mobile station 101, a mobile station 102, a base station 103, a base station 104, a cell 105 and a cell 106. Here, consideration is given for the case where the base station 103 and the base station 104 perform communication using the CDMA system, and carriers of the base station 103 and the base station 104 are different. The cell 105 represents a service area of the base station 103 and is extended in the vicinity of the base station 104. On the other hand, the cell 106 is the service area of the base station 104.

When the mobile station 102 is in communication with the base station 104 at proximal position to the base station 104 and the mobile station 101 is in communication with the base station 103 with traveling from proximal position to the base station 103 to distal position thereof, the transmission power and the adjacent-channel leak power of the mobile station 101 increase according to traveling toward the distal position by transmission power control of the base station 103 to the mobile station 101. When the mobile station 101 approaches to the base station 104, the transmission power and the adjacent-channel leak power of the mobile station 101 arrive to the base station 104 at higher power.

If the communication frequency used by the base station 103 and the communication frequency used by the base station 104 are adjacent with each other, the transmission power transmitted from the mobile station 102 may submerge in the adjacent-channel leak power transmitted from the mobile station 101, In such case, a problem is encountered in that the base station 104 cannot receive the signal of the mobile station 102 correctly. This is because that the transmission power of the mobile station 102 is lower power for transmission power control of the base station 104 in the mobile station 102.

As a solution for this problem, a linearizer for compensating non-linear distortion of the transmitter is employed. As set forth above, as the linearizer, one taking output only non-linear signal from a transmission signal transmitted and compensating non-linear distortion by subtracting the taken out non-linear distortion signal, or one preliminarily multiplying a signal having distortion compensating characteristics to a transmission signal before radio transmission process, such as frequency conversion, amplification and so forth with taking a non-linear distortion to be caused in the transmitter into account, for compensating distortion. The former is not practical for increasing of current consumption due to increasing of circuit scale and for complexity of process. Therefore, the latter is primarily used as the non-linear distortion compensation circuit. Particularly, the later linearizer is called as pre-distortion type linearizer.

Prior art used in such pre-distortion type linearizer is shown in FIG. 7. It should be noted that the construction shown in FIG. 7 has been disclosed in Japanese Unexamined Patent Publication No. Heisei 10-23095. Referring to FIG. 7, a transmission signal is consisted with two-system of data, i.e. digital I data and Q data which are supplied to respective input terminals 21 and 22. These input data are supplied to a pre-distorter 25 via FIR filters 23 and 24 to obtain digital I data and Q data superimposed an inverted component of the non-linear distortion caused by a variable power amplifier 29.

To the pre-distorter 25, a transmission power control signal from a transmission power controller 34 is supplied in addition to I and Q data. The pre-distorter 25 derives the inverted component of the non-linear distortion by arithmetic process on the basis of the transmission power control signal and I and Q data. The inverted component thus derived is superimposed on the I and Q data. An output data of the pre-distorter 25 is converted into an analog signal by a D/A converter 26 and then is modulated by the modulator 27 with an output of an oscillator 28. Thus, I and Q signals (data) are modulated by orthogonal modulation. On the other hand, for CDMA system, spreading process by the spreading code is performed by the modulator 27.

Then, the transmission signal thus modulated by spreading is supplied to a variable power amplifier 29 to be amplified with an amplifier gain determined by a transmission power control signal from a transmission power controller 34. By this amplifier 29, non-linear distortion can be caused. An amplified output is mixed with an oscillation frequency from a frequency synthesizer 31 in a mixer 30 and then is transmitted as radio signal from an antenna 33 with amplification with a given gain by an amplifier 32.

It should be noted that the transmission power control signal output from the transmission power controller 34 is generated on the basis of a power control information bit input from a terminal 35 and a reception level information signal input from a terminal 36. Here, the power control information bit is a power control information bit data contained in the signal transmitted to own radio transmitter device from a counterpart (generally, the base station) to communicate. On the other hand, a reception level information signal is information of a reception level of a reception signal transmitted from the base station.

Thus, occurrence condition of non-linear distortion in the power amplifier 29 variable of amplifier gain can be accurately judged by the pre-distorter 25. Then, on the basis of occurrence condition of the non-linear distortion as judged, compensation component as inverted component of the non-linear distortion can be generated. With the compensation component, even when the amplifier gain is varied by the power amplifier 29, accurate distortion compensation corresponding to the amplifier gain can be performed.

Next, discussion will be given for a relationship between the conventional transmitter shown in FIG. 7 and a transmission power control effected for the mobile station (mobile communication equipment) by the base station. In case of CDMA system, the base station may discriminate the channel on reception or the mobile station in communication by the spreading code. Therefore, the base station may discriminate a power of a desired wave on reception and power of other reception signals, from the reception signal and thus can derive S/N ratio of the channel on reception. Transmission power control is performed depending upon the S/N ratio of the channel on reception. Namely, the base station derives a power of the desired wave and a power of interfering wave for deriving the S/N ratio of the channel on reception.

When the S/N ratio is less than or equal to the predetermined value, the base station transmits the control signal for increasing power of the transmission signal of the mobile station to the mobile station. On the other hand, when the S/N ratio is greater than the predetermined value, the base station transmits the information for reducing the transmission power so that the transmission power of the mobile station on communication will not interfere communication of other mobile station in communication. Calculation of S/N ratio executed by the base station is performed per time slot forming the transmission frame transmitted by the base station. Thus, the transmission control information is updated per time slot. A relationship between the transmission frame transmitted by the base station and the transmission power control information transmitted is shown in FIG. 8. Process of transmission power control to be executed will be discussed with reference to FIG. 8.

Referring to FIG. 8, one frame to be transmitted is consisted of n in number of time slots TS1 to TSn. One slot is consisted of the control information, transmission power control information and communication data. The mobile station on reception of the signal transmitted by the base station demodulats to extract the transmission power control information from the demodulated reception signal and performs transmission power control of the transmitter per time slot.

In this case, the compensation of the non-linear distortion performed on the basis of detected transmission power of the signal transmitted in the time slot TSi at a certain timing may compensate distortion of the transmission signal transmitted in the next time slot TS(i+1). However, since the transmission signal transmitted in the time slot TS(i+1) is differentiated the transmission power from the transmission power in the time slot TSi by the transmission power control, correct non-linear distortion compensation cannot be performed.

As set forth above, in the prior art, the non-linear distortion compensation to be performed on the basis of detected transmission power transmitted in the time slot TSi at a certain timing is effected for distortion compensation of the transmission signal of the transmission in the next time slot TS(i+1). However, since the transmission power transmitted in the time slot TS(i+1) is differentiated from the transmission power of the time slot TSi, correct non-linear distortion compensation cannot be performed.

On the other hand, it becomes important to perform the distortion compensation by the pre-distorter per bit (symbol) consisting the transmission data in each time slot of the transmission signal in order to make it accurate. However, in the construction shown in FIG. 7, compensation per bit (symbol) is not considered at all.

SUMMARY OF THE INVENTION

An object of the present invention is to provide a non-linear distortion compensation circuit, a transmission equipment employing the same and a mobile transmission equipment, in which a mobile station can accurately compensate distortion caused by non-linearity of a transmitter per bit (symbol) even while the base station is performing transmission power control for the transmitter of the mobile station.

According to the first aspect of the present invention, a non-linear distortion compensation circuit in a transmission equipment for controlling a transmission power depending upon an external transmission power control information upon transmission of a digital signal, comprises:

compensation component generating means for generating a compensation component for a non-linear distortion depending upon a transmission power per bit of the digital signal and the transmission power control information; and compensating means for compensating the non-linear distortion of the transmission signal by the compensation component.

According to the second aspect of the present invention, a transmission equipment comprises:

a transmitter including component which causing non-linear distortion;

a non-linear distortion compensation circuit in a transmission equipment for controlling a transmission power depending upon an external transmission power control information upon transmission of a digital signal, including compensation component generating means for generating a compensation component for a non-linear distortion depending upon a transmission power per bit of the digital signal and the transmission power control information, and compensating means for compensating the non-linear distortion of the transmission signal by the compensation component.

According to the third aspect of the present invention, a mobile communication equipment comprises:

a receiver receiving a signal from a communication counterpart, the signal containing a transmission power control information;

a transmission equipment comprising a transmitter including component which causing non-linear distortion, a non-linear distortion compensation circuit in a transmission equipment for controlling a transmission power depending upon the transmission power control information upon transmission of a digital signal, including compensation component generating means for generating a compensation component for a non-linear distortion depending upon a transmission power per bit of the digital signal and the transmission power control information, and compensating means for compensating the non-linear distortion of the transmission signal by the compensation component.

The compensation component generating means may generate the compensation component per bit, and the compensation means may perform compensation of the non-linear distortion according to the compensation component per bit. The compensation component generating means may calculate the transmission power per bit on the basis of an instantaneous transmission power value and an average value of the transmission power, and generate the compensation component per bit according to the result of calculation and the transmission power control information. The compensation component generating means may comprise storage means for preliminarily storing a compensation data as the compensation component and address generating means for generating an address of the storage means on the basis of the transmission power per bit and the transmission power control information. The address generating means may be constructed to generate the address by addition of the transmission power per bit and the transmission power control information. The address generating means may derive the transmission power per bit is calculated by addition of an instantaneous transmission power and an average value of the transmission power. The transmission signal may be a time slot type, the external transmission power control information may be set for controlling the transmission power per transmission time slot, the address generating means may derive the transmission power per bit by addition of an average power value of a transmission time slot at a certain timing and an instantaneous power value per each bit of subsequent transmission time slot. The transmission power control information may be information for transmission power control for subsequent transmission time slot. The storage means may be a read-only memory.

The transmission power control signal may be respectively superimposed per time slot of the signal transmitted from the base station.

In the operation of the present invention, ROM address depending upon the transmission power per bit of the transmission signal and the transmission power control information is generated by the address generating portion generating the address of the compensation data storage ROM storing the non-linear distortion data to be used for performing non-linear distortion by the pre-distortion type linearizer. Particularly, the transmission power control information may reflect the time slot as control object.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details.

Figure 1:
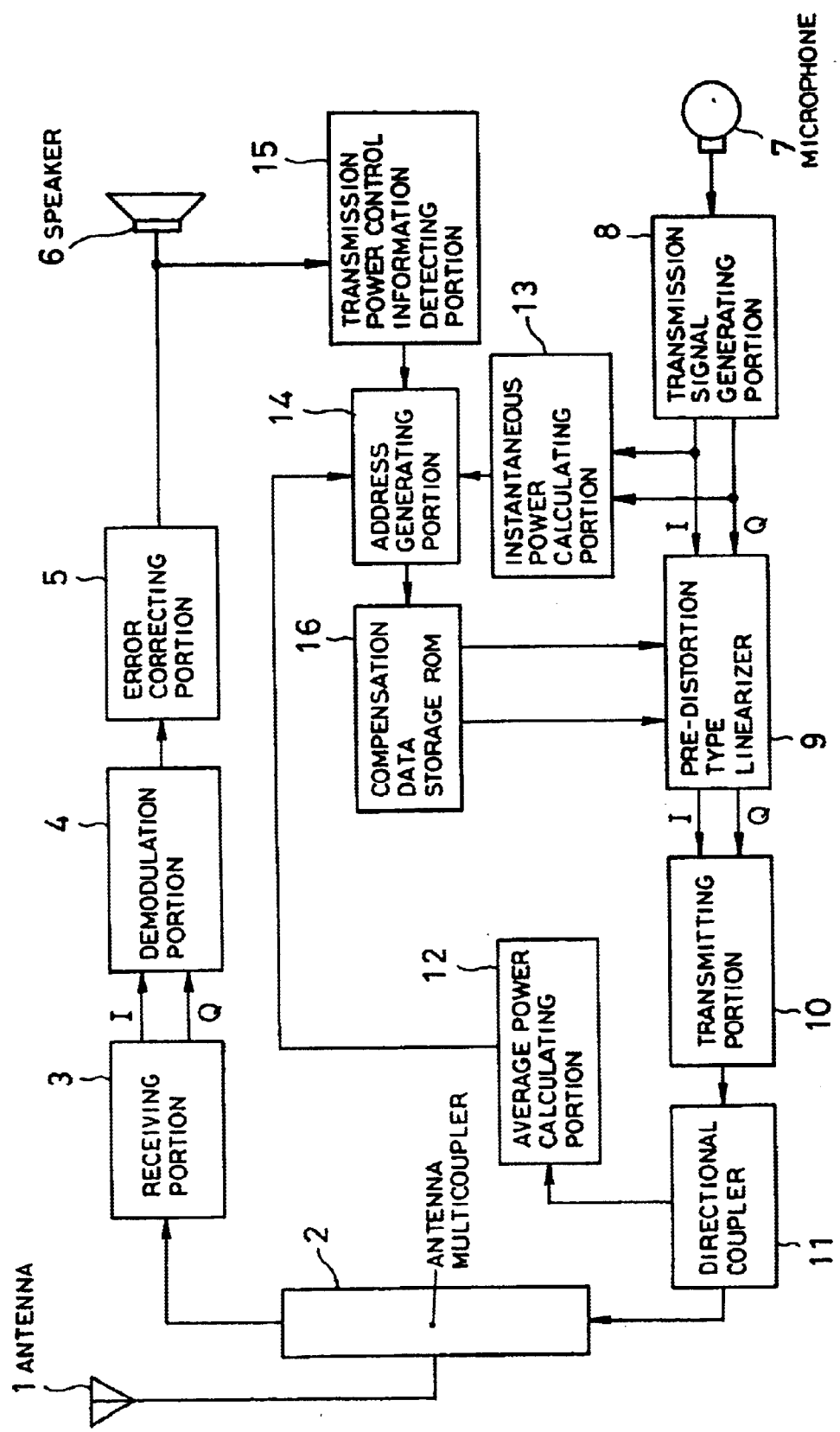
FIG. 1 is a block diagram of the preferred embodiment of the present invention.

FIG. 1 is a schematic block diagram showing an overall construction of the preferred embodiment of a mobile station according to the present invention. Referring to FIG. 1, a reception signal from the antenna 1 is input to a receiving portion 3 via an antenna multicoupler 2 for reception process to be extracted I and Q of a base band signal. Thereafter, the I and Q components thus extracted are input to a demodulating portion 4 for demodulation process (dispreading process), and then is output from a speaker 6 as an audible sound after error correction in an error correcting portion 5.

On the other hand, a voice signal from a microphone 7 is converted into a digital signal by a transmission signal generating portion 8 and then subject to a linear modulation process (generally, QPSK modulation process) to be lead as signals of I and Q components. Subsequently, compensation of non-linear distortion is performed by a pre-distortion type linearizer 9. Then, transmission process is performed by a transmitting portion 10. Thereafter, a radio wave signal as a transmission signal is transmitted through the antenna via a directional coupler 11 and the antenna multicoupler 2.

The transmission signal branched by the directional coupler 11 is derived by an average power value per time slot of the transmission signal input to an average power calculating portion 12. On the other hand, the I and Q components as output of the transmission signal generating portion 8 is input to an instantaneous power calculating portion 13. Thus, the instantaneous transmission power is calculated per bit (symbol). Furthermore, the transmission power control information is detected from output of the error correcting portion 5 by transmission power control information detecting portion 15. It should be noted that the transmission power control information is not supplied to the speaker 6.

Respective outputs of the average power calculating portion 12, the instantaneous power calculating portion 13 and the transmission power control information detecting portion 15 are supplied to an address generating portion 14 for generating an address for accessing a compensation data storage ROM 16. By the address thus generated, a compensation data is read out to be supplied to the pre-distortion type linearizer 9.

Figure 2:
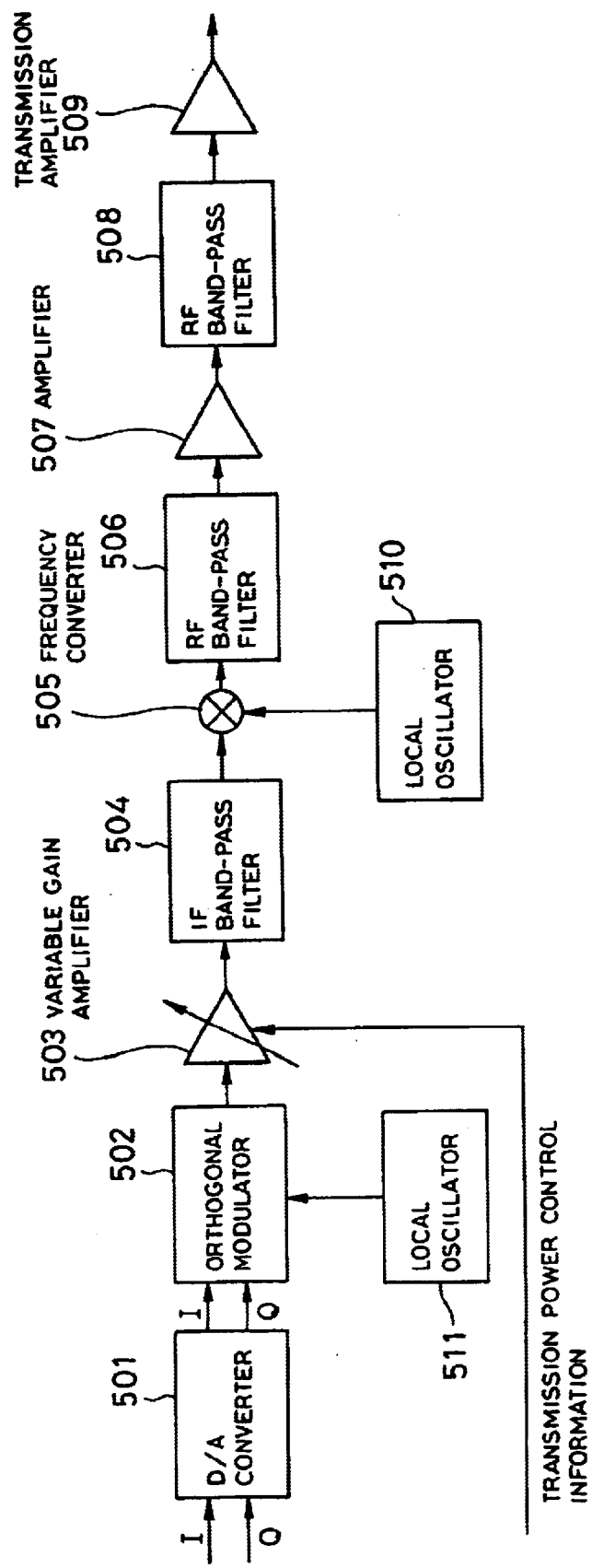
FIG. 2 is an illustration showing a particular construction of a transmitter of FIG. 1.

A construction of the transmitting portion 10 is shown in FIG. 2. The transmitting portion 10 is constructed with a D/A converter 501, an orthogonal modulator 502, a variable gain amplifier 503, an intermediate band pass filter 504, a frequency converter (mixer) 505, a first radio frequency band pass filter 506, an amplifier 507, a second radio frequency band pass filter 508, a transmission amplifier 509, a first local oscillator 510 and a second local oscillator 511.

The D/A converter 501 converts the transmission signal of an intermediate band from digital signal to analog signal. The orthogonal modulator 502 performs orthogonal modulation of the transmission signal of the base band and performs frequency conversion into a transmission signal in the intermediate frequency band. The variable gain amplifier 503 is an amplifier for amplifying the transmission signal according to received transmission power control information. The intermediate frequency band pass filter 504 is a filter passing the transmission signal of the intermediate frequency band.

The frequency converter 505 performs frequency conversion of the transmission signal of intermediate frequency band into the transmission signal of radio frequency band. The first radio frequency band pass filter 506 and the second radio frequency band pass filter 508 are filters passing only signal of a transmission band and suppressing unnecessary radiation caused in the frequency amplifier 505 or the amplifier 507.

The amplifier 507 is an amplifier amplifying the transmission signal. The transmission amplifier 509 is an amplifier for amplifying the transmission signal up to a power for transmission through the antenna. The first local oscillator 510 is an oscillator for oscillating a local oscillation signal to be used upon frequency conversion in the frequency converter 505. The second local oscillator 511 is an oscillator oscillating a local oscillation signal to be used upon frequency oscillation in the orthogonal modulator 502.

I and Q component signal input ends of the D/A converter 501 match with I and Q component signal input ends of the transmitting portion 10 and an output end of the transmission amplifier 509 matchs with an output end of the transmitting portion 10. The I and Q component signal output ends of the D/A converter 501 are connected to the I and Q component signal input ends of the orthogonal modulator 502. An intermediate frequency band signal output end of the orthogonal modulator 502 is connected to an input end of the variable gain amplifier 503. An output end of the variable gain amplifier 503 is connected to an input end of the intermediate frequency band pass filter 504. An output end of the intermediate frequency band pass filter 504 is connected to an intermediate frequency band signal input end of the frequency converter 505. A radio frequency band output end of the frequency converter 505 is connected to an input end of the first radio frequency band pass filter 506.

An output end of the first radio frequency band pass filter 506 is connected to an input end of the amplifier 507. An output end of the amplifier 507 is connected to an input end of the second radio frequency band pass filter 508. An output end of the second radio frequency band pass filter 508 is connected to an input end of the transmission amplifier 509. On the other hand, an output end of the first local oscillator 510 is connected to a local signal input end of the frequency converter 505. A radio frequency band output end of the frequency converter 505 is connected to an input end of the first radio frequency band pass filter 506.

An output end of the first radio frequency band pass filter 506 is connected to an input end of the amplifier 507. An output end of the amplifier 507 is connected to an input end of the second radio frequency band pass filter 508. An output end of the second radio frequency band pass filter 508 is connected to an input end of the transmission amplifier 509. Also, an output end of the first local oscillator 510 is connected to a local signal input end of the frequency converter 505. An output end of the second local oscillator 511 is connected to a local signal input of the orthogonal modulator 502. A gain control signal input end of the variable gain amplifier 503 is connected to a transmission power control information output end of a transmission power control information unit (not shown).

Figure 3:
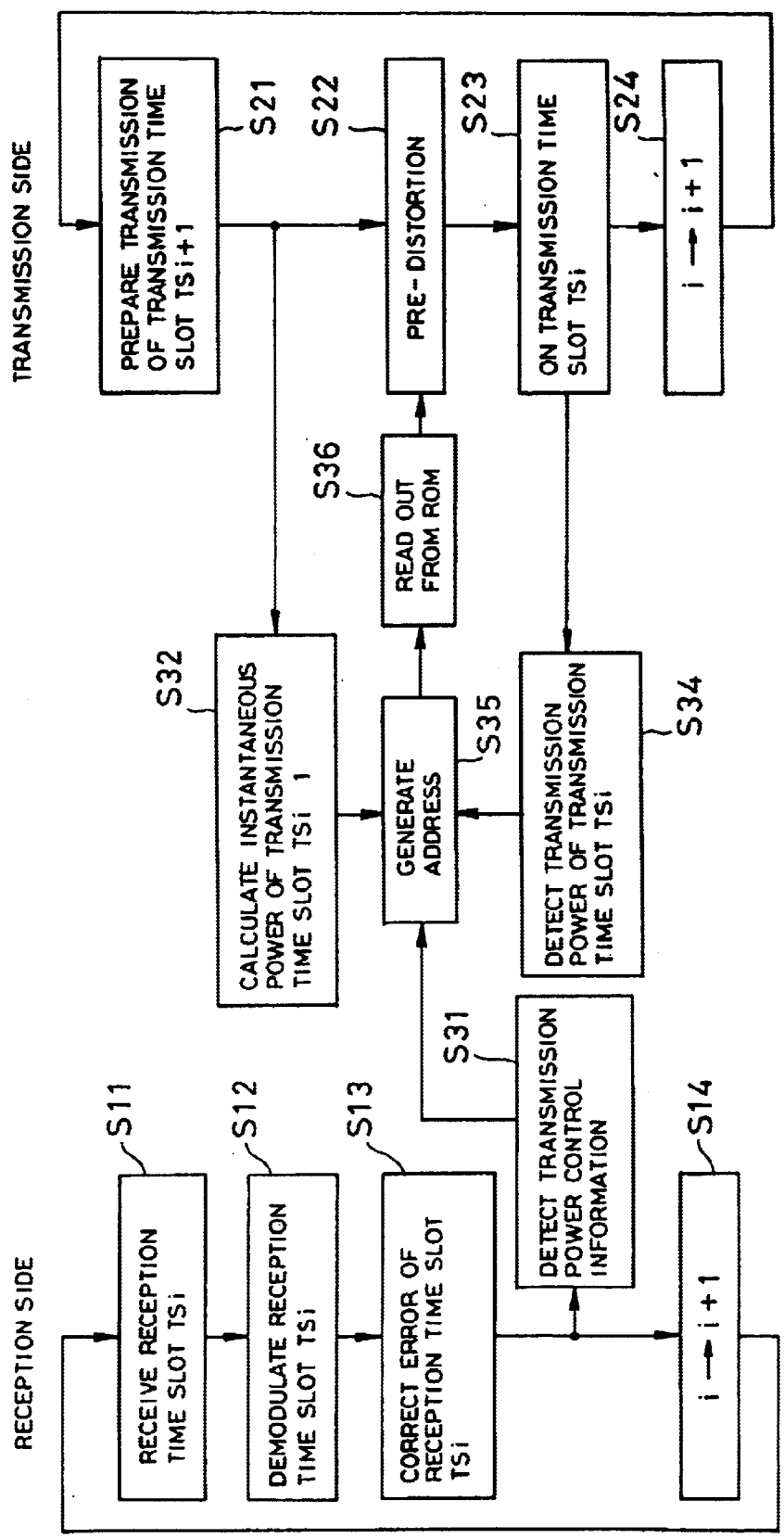
FIG. 3 is a general flowchart showing operation of the present invention.

Operation of the shown embodiment will be discussed hereinafter with reference to a flowchart of FIG. 3. In a receiving portion 3, the time slot TSi is received from the base station (step S11). In the demodulating portion 4, demodulation process of the time slot TSi is performed (step S12). Subsequently, in the error correcting portion 5, error correction process of the time slot TSi is performed in the error correcting portion 5 (step S13). Then, next time slot TS(i+1) is received (step S14). After error correction at step S13, in the transmission power control information detecting portion 15, the transmission power control information is extracted from the received signal of the time slot TSi (step S31) to be output to the address generating portion 14. It should be noted that the transmission power control information is a control information for controlling the transmission power of the transmission time slot TS(i+1) on the transmission side.

On reception side, when the time slot TSi is received at step S11, signal processing for the transmitted data, such as error correction and so forth, is effected for the transmission data, such as voice or the like for the transmission time slot TS(i+1) and the transmission frame is generated according to a transmission frame format. Thereafter, the transmission signal is spread using the spreading code. The spread transmission signal is output separately as I component and Q component signals (step S21). The transmission signals of I component and Q component output from the transmission signal generating portion 8 is input to the pre-distortion type linearizer 9. In conjunction therewith, the transmission signals of I component and Q component are also input to the instantaneous power calculating portion 13. In the instantaneous power calculating portion 13, instantaneous powers of the input I component signal and Q component signal (step 32) are derived to output to the address generator 14.

On the other hand, the I component and Q component signals input to the pre-distortion type linearizer 9 are compensated non-linear distortion by the non-linear distortion compensation data read out from the compensation data storage ROM 16 (step S36) and are output to the transmitting portion 10. Operation of the transmitting portion 10 will be discussed with reference to FIG. 2. The I component and Q component signals input to the transmitting portion 10 are converted from digital signal into analog signal by the D/A converter 501.

The orthogonal modulator 502 performs orthogonal modulation for the I component and Q component signals output from the D/A converter 501 using local oscillation signal oscillated by the second local oscillator 511, and the transmission signal of the base band is converted into the transmission signal of the intermediate frequency band. The transmission signal converted into the transmission signal of the intermediate frequency band is amplified according to the transmission power control information by the variable gain amplifier 503 and then input to the frequency converter 505 via the intermediate frequency band pass filter 504.

The gain of the variable gain amplifier 503 is variable depending upon transmission power control information output by the transmission power control information detecting portion 15. The frequency converter 505 performs frequency conversion of the input transmission signal of the intermediate frequency band into the transmission signal of radio frequency band using the local oscillation frequency oscillated by the first local oscillator 510. The transmission signal of the radio frequency band thus converted passes through the first radio frequency band pass filter 506, the amplifier 507, the second radio frequency band pass filter 508, amplified upon to the power to be transmitted through antenna 1 by the transmission amplifier 509 and then is output from the transmitting portion 10.

The transmission signal thus output from the transmitting portion is input to the directional coupler 11 and is output from an inserting direction output end to be transmitted through the antenna 1, and in conjunction therewith, is output from a coupling direction output end to be input to an average power calculating portion 12. In the average power calculating portion 12, an average power per unit time slot of the input transmission signal is derived to output the result of detection for the address generating portion 14. At this time, on the transmission side, transmission of the transmission time slot TSi is transmitted (step S23). Thus, an average value of the transmission power of the transmission time slot TSi is derived in the average power calculating portion 12 (step S34) to be output to the address generating portion 14.

In the address generating portion 14, the address for accessing the compensation data storage ROM 16 is generated using the result of calculation output from the instantaneous power calculating portion 13, the result of calculation output from the average power calculating portion 12 and the transmission power control information output from the transmission power control information detecting portion 15 (step S35) to designate the address of ROM 16. ROM 16 outputs the non-linear distortion compensation data according to the address designated by the address generating portion 14 to the pre-distortion type linearizer 9.

In the pre-distortion type linearizer 9, process for compensating non-linear distortion of the I component and Q component signals to transmit using, the non-linear distortion compensation data input from the compensation data storage ROM 16 is performed (step S23). Then, preparation for transmission of the next time slot TS(i +1) is performed (step S24).

Figure 4:
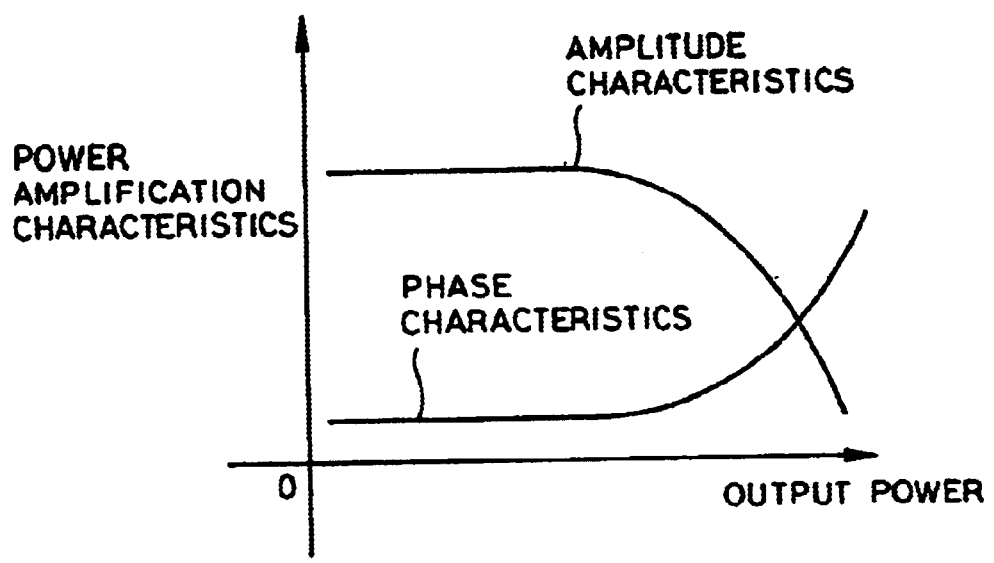
FIG. 4 is an illustration showing an amplitude and phase characteristics for an output power of a power amplifier.

Next, discussion will be given for the compensation data stored in the compensation data storage ROM 16 and its address. The signal to be transmitted can be expressed as a function of amplitude and phase. The characteristics of the power amplifier in the transmitting portion 10 is expressed as characteristics of both of amplitude and phase as shown in FIG. 4. Namely, by increasing of the output power, characteristics of amplitude and phase are degraded to cause non-linear distortion. Therefore, it can be said that the non-linear distortion is amplitude distortion for amplitude of the transmission signal and phase distortion for the phase of the transmission signal. Assuming that amplitude distortion caused in the transmitting portion 10 is $\Delta A$ and phase distortion is $\Delta P$, the non-linear distortion to be caused in the transmitter 206 can be canceled by providing components of $-\Delta A$ and $-\Delta P$ to the transmission signal. Namely, the non-linear compensation data stored in the compensation data storage ROM 16 has to be data having inverted characteristics of amplitude distortion and phase distortion to be caused in the transmitting portion 10.

In other words, when the transmission power can be seen, amount of amplitude and phase in the known transmission power can be determined in straightforward manner as shown in FIG. 4. As a result, the amplitude distortion $\Delta A$ and the phase distortion $\Delta P$ are determined in straightforward manner. Accordingly, by preliminarily storing the compensation data $-\Delta A$ and $-\Delta P$ for the transmission power in ROM 16, the compensation data may be read out from ROM with taking the derived transmission power as address.

Therefore, in the present invention, the transmission power per bit of the transmission time slot TS(i+1) is derived using the average transmission power of certain time slot TSi, instantaneous powers of I component and Q component to be transmitted in the next time slot TS(i+1) and the transmission power control information for the time slot TS(i+1). Namely, the correct transmission power value per bit to be transmitted finally is derived by adding the instantaneous power value (per bit) of the transmission in the time slot TS(i+1) to be compensated to the average transmission power value of the one preceding transmission time slot TSi for deriving the transmission power value per bit, and to the sum thus derived, adding the transmission power control information for the transmission time slot TS(i+1).

For example, if the average transmission power value is "10" and the instantaneous power value per bit is "15", the transmission power per bit becomes "10"+"15"="25". Furthermore, to this value, "±1" or "0" (the control information is three kinds of information to set the transmission power to +1, −1 and keep unchanged) as the transmission power control information is added. Assuming that the transmission power control information is set to "+1", the correct transmission power per bit becomes "26". By setting this as ROM address, it becomes equivalent to the power value of the lateral axis of the characteristics shown in FIG. 4 to "26". As set forth above, since respective of amplitude value and phase value are obtained, the inverted components of the non-linear distortion corresponding to the amplitude value and the phase value can be read out to enable pre-distortion.

Figure 5:
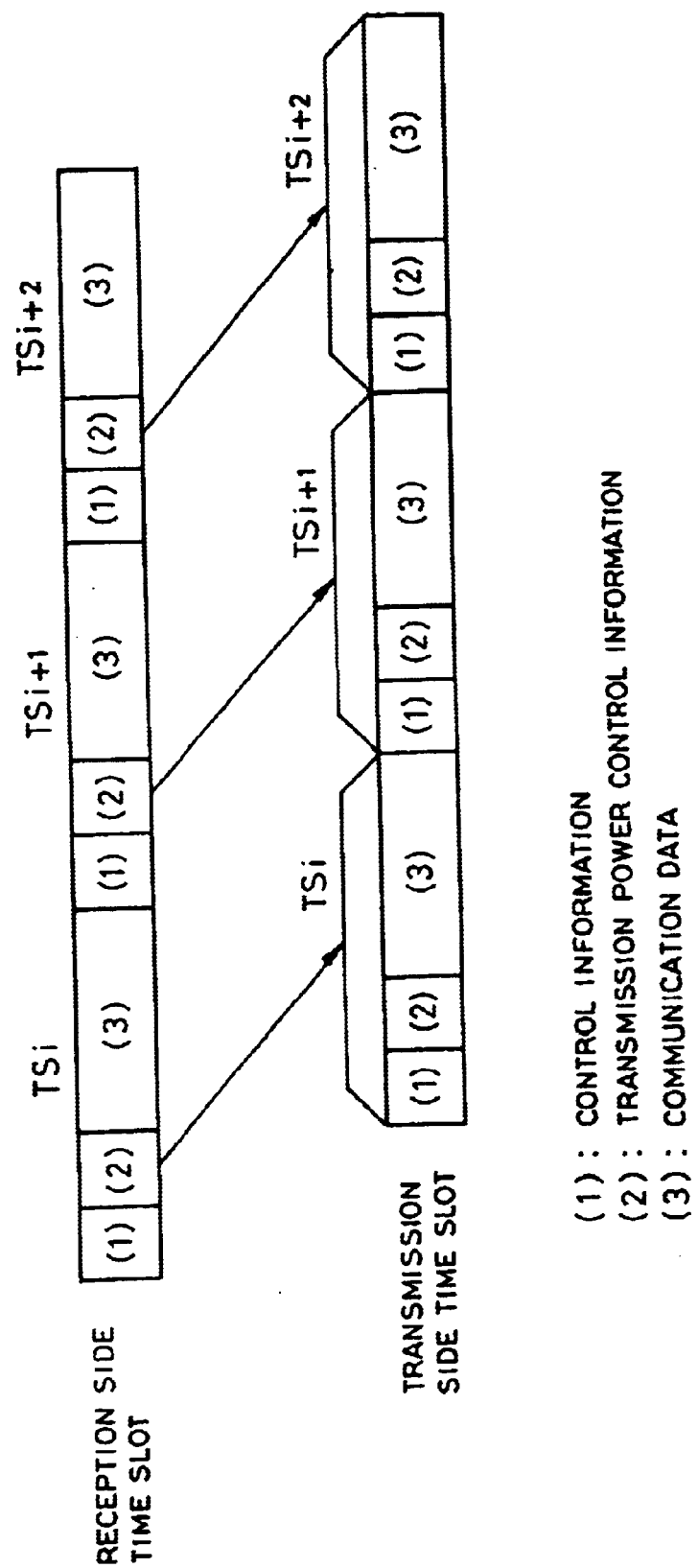
FIG. 5 is an illustration showing a relationship between a reception time slot on reception side and a transmission time slot on transmission side.
Figure 6:
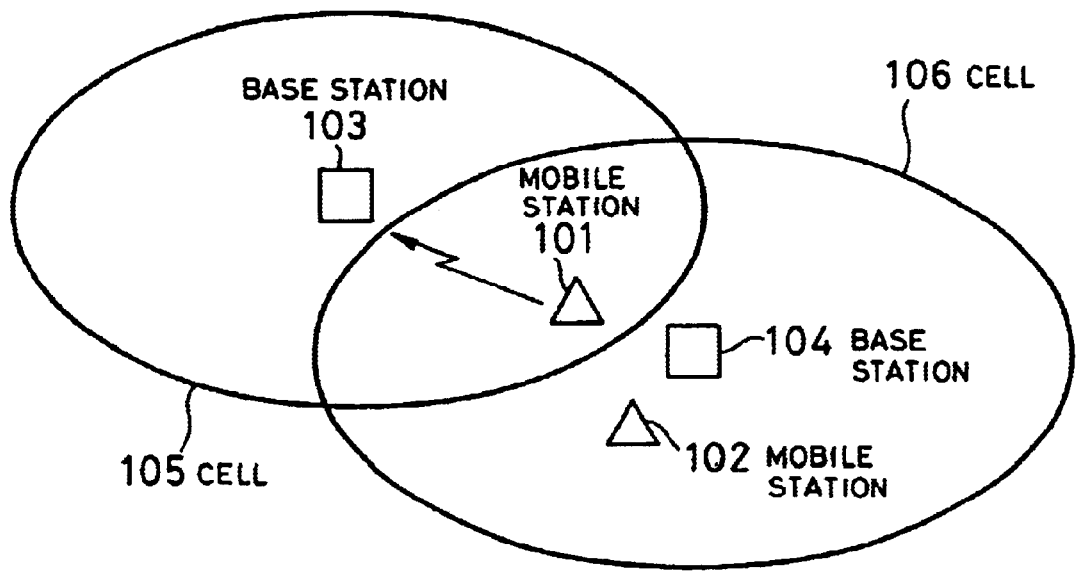
FIG. 6 is an illustration for explaining influence of an adjacent-channel leak power to other system.
Figure 7:
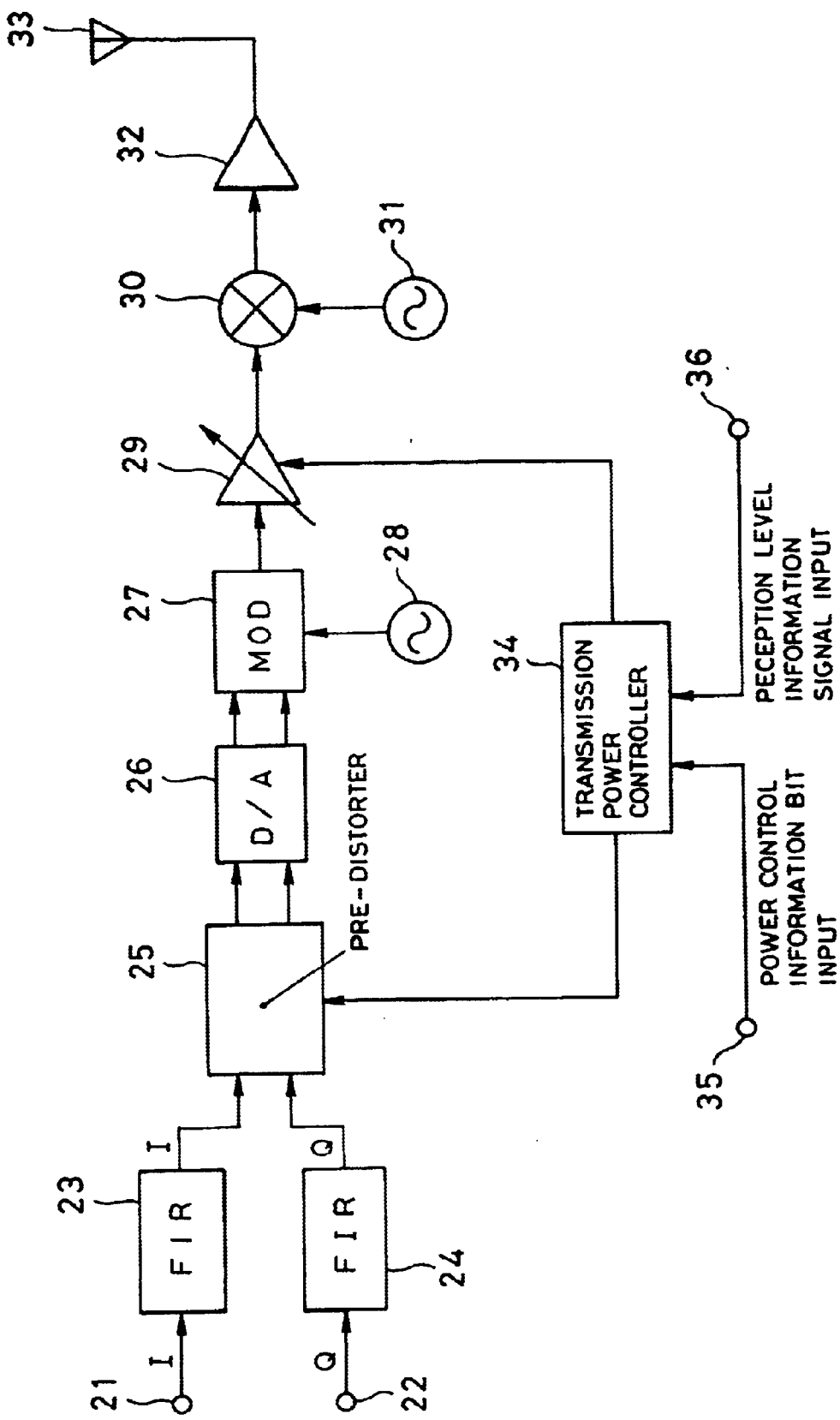
FIG. 7 is a block diagram showing a prior art of the conventional mobile station.
Figure 8:
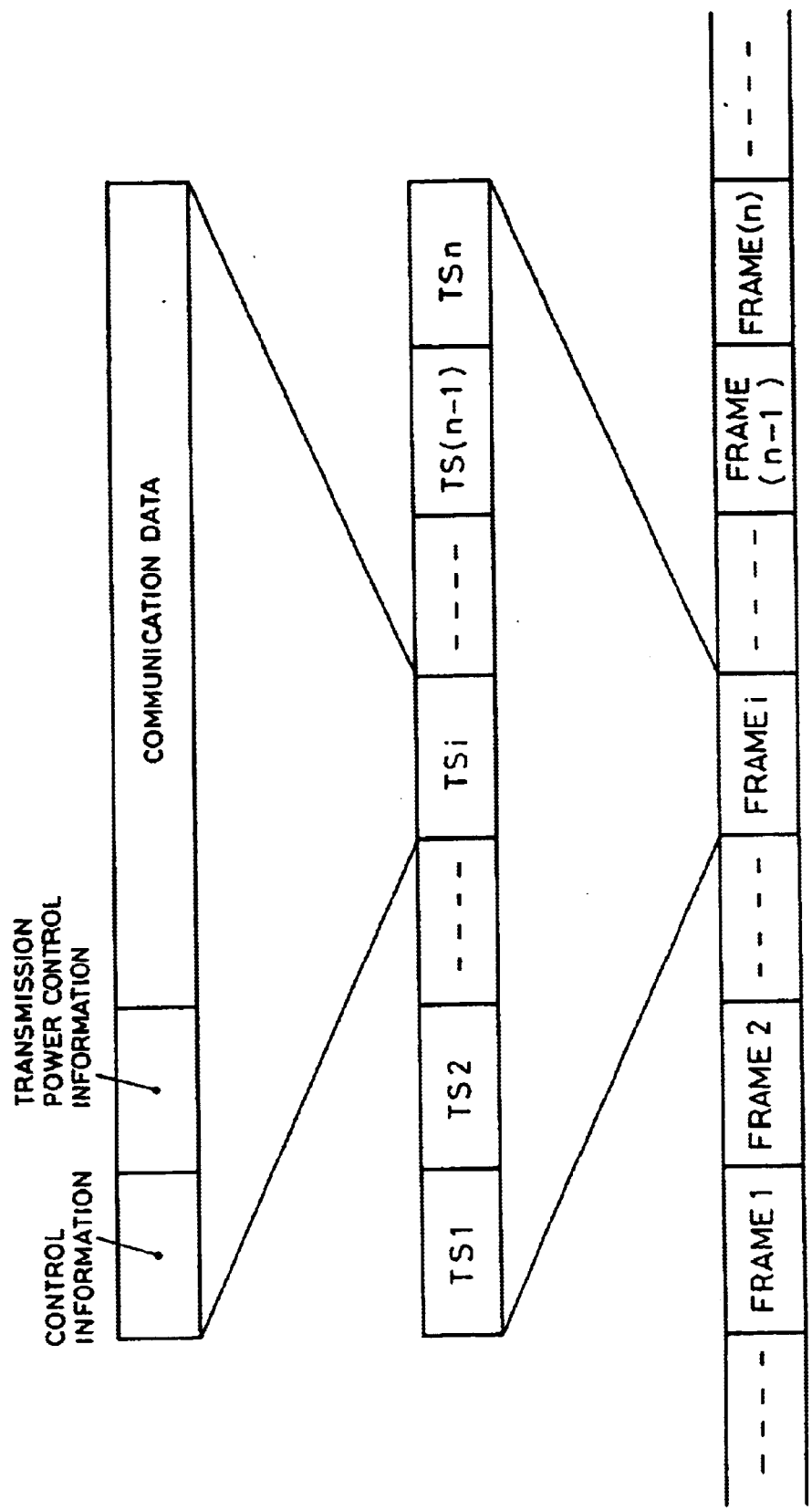
FIG. 8 is an illustration showing a relationship between a transmission frame transmitted by a base station and a transmission power control information transmitted.

With taking the foregoing in mind, operation of the pre-distortion type linearizer will be discussed with reference to FIG. 5. In FIG. 5, (1) represents control information, (2) represents the transmission power control information, (3) represents the communication data, respectively. On the other hand, the upper level shows reception time slots and the lower level shows transmission time slots.

The transmission power control information received at the reception time slot TS(i+1) becomes effective in the transmission time slot TS(i+1). Assuming that the signal currently transmitted is the transmission signal of the time slot TSi, the average power calculated by the average power calculating portion 12 becomes the average power of the transmission signal of the transmission time slot TSi. However, the transmission signal of the transmission time slot TSi is on transmission, and naturally, the transmission signal has past through the pre-distortion type linearizer 9. In the linearizer 9 and the instantaneous power calculating portion 13, the transmission signal of the next transmission time slot TS(i+1) is input for compensation for distortion.

At this time, ROM address for taking the distortion compensation data is generated on the basis of the average power of the transmission signal, the instantaneous power of the transmission signal and the transmission power control information (to be added). Accordingly, as a result, the average power of the transmission signal is an average power of the transmission time slot TSi, the instantaneous power of the transmission signal is the instantaneous power of the transmission time slot TS(i+1), and for interpolation of this, the transmission power control information for the transmission time slot TS(i+1) is used.

As set forth above, when the pre-distortion type linearizer 9 is used for compensation for the non-linear distortion to be caused in the transmission signal by the non-linearity of the transmitting portion 10, the non-linear distortion compensation data of the transmitting portion 10 is derived preliminarily and are corresponded to the transmission power in one-by-one basis to establish correspondence between the transmission power and the compensation data ROM 16. The address of the compensation data storage ROM 16 storing the data for compensating the non-linear distortion is generated using the instantaneous power calculated from the I component and Q component signals to be transmitted, the average transmission power per unit slot of the transmission signal and the transmission power control information. Then the non-linear distortion compensation data is taken out from the compensation data storage ROM 16 to provide non-linear compensation for the transmission signal by the pre-distortion type linearizer.

As set forth above, according to the present invention, non-linear distortion in the transmitting portion of the mobile communication equipment is compensated using the pre-distortion type linearizer per bit (symbol) of the transmission power. Furthermore, since compensation is performed with taking the transmission power control information from the base station into account, more accurate compensation operation of the non-linear distortion can be performed.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A non-linear distortion compensation circuit in a transmission equipment for controlling a transmission power depending upon an external transmission power control information upon transmission of a digital signal, comprising:

compensation component generating means for generating a compensation component for a non-linear distortion depending upon a transmission power per bit of said digital signal and said external transmission power control information; and compensating means for compensating said non-linear distortion of the transmission signal by said compensation component, wherein said transmission signal is a time slot type, said external transmission power control information is set for controlling the transmission power per transmission time slot, said address generating means derives said transmission power per bit by addition of an average power value of a transmission time slot at a certain timing and an instantaneous power value per each bit of subsequent transmission time slot.

2. A non-linear distortion compensation circuit as set forth in claim 1, wherein said compensation component generating means generates said compensation component per bit, and said compensation means performs compensation of said non-linear distortion according to the compensation component per bit.

3. A non-linear distortion compensation circuit as set forth in claim 2, wherein said compensation component generating means calculates the transmission power per bit on the basis of an instantaneous transmission power value and an average value of the transmission power, and generates the compensation component per bit according to the result of calculation and said transmission power control information.

4. A non-linear distortion compensation circuit as set forth in claim 1, wherein said compensation component generating means comprises storage means for preliminarily storing a compensation data as said compensation component and address generating means for generating an address of said storage means on the basis of the transmission power per bit and said transmission power control information.

5. A non-linear distortion compensation circuit as set forth in claim 4, wherein said address generating means is constructed to generate said address by addition of said transmission power per bit and said transmission power control information.

6. A non-linear distortion compensation circuit as set forth in claim 5, wherein said address generating means derives the transmission power per bit by addition of an instantaneous transmission power and an average value of the transmission power.

7. A non-linear distortion compensation circuit as set forth in claim 1, wherein said transmission power control information is information for transmission power control for subsequent transmission time slot.

8. A non-linear distortion compensation circuit as set forth in claim 4, wherein said storage means is a read-only memory.

9. A transmission equipment comprising:
   a transmitter including component which causing nonlinear distortion;
   a non-linear distortion compensation circuit in a transmission equipment for controlling a transmission power depending upon an external transmission power control information upon transmission of a digital signal, including compensation component generating means for generating a compensation component for a non-linear distortion depending upon a transmission power per bit of said digital signal and said external transmission power control information, and compensating means for compensating said non-linear distortion of the transmission signal by said compensation component,
   wherein said transmission signal is a time slot type, said external transmission power control information is set for controlling the transmission power per transmission time slot, said address generating means derives said transmission power per bit by addition of an average power value of a transmission time slot at a certain timing and an instantaneous power value per each bit of subsequent transmission time slot.

10. A transmission equipment as set forth in claim 9, wherein said compensation component generating means generates said compensation component per bit, and said compensation means performs compensation of said non-linear distortion according to the compensation component per bit.

11. A transmission equipment as set forth in claim 10, wherein said compensation component generating means calculates the transmission power per bit on the basis of an instantaneous transmission power value and an average value of the transmission power, and generates the compensation component per bit according to the result of calculation and said transmission power control information.

12. A transmission equipment as set forth in claim 9, wherein said compensation component generating means comprises storage means for preliminarily storing a compensation data as said compensation component and address generating means for generating an address of said storage means on the basis of the transmission power per bit and said transmission power control information.

13. A transmission equipment as set forth in claim 12, wherein said address generating means is constructed to generate said address by addition of said transmission power per bit and said transmission power control information.

14. A transmission equipment as set forth in claim 13, wherein said address generating means derives the transmission power per bit is calculated by addition of an instantaneous transmission power and an average value of the transmission power.

15. A transmission equipment as set forth in claim 9, wherein said transmission power control information is information for transmission power control for subsequent transmission time slot.

16. A mobile communication equipment comprising:
   a receiver receiving a signal from a communication counterpart, said signal containing a transmission power control information;
   a transmission equipment comprising a transmitter including component which causing non-linear distortion, a non-linear distortion compensation circuit in a transmission equipment for controlling a transmission power depending upon said transmission power control information upon transmission of a digital signal, including compensation component generating means for generating a compensation component for a non-linear distortion depending upon a transmission power per bit of said digital signal and said transmission power control information, and compensating means for compensating said non-linear distortion of the transmission signal by said compensation component,
   wherein said transmission power control signal is respectively superimposed per time slot of the signal transmitted from the base station.

17. A mobile communication equipment as set forth in claim 16, wherein said compensation component generating means generates said compensation component per bit, and said compensation means performs compensation of said non-linear distortion according to the compensation component per bit.

18. A mobile communication equipment as set forth in claim 17, wherein said compensation component generating means calculates the transmission power per bit on the basis of an instantaneous transmission power value and an average value of the transmission power, and generates the compensation component per bit according to the result of calculation and said transmission power control information.

19. A mobile communication equipment as set forth in claim 16, wherein said compensation component generating means comprises storage means for preliminarily storing a compensation data as said compensation component and address generating means for generating an address of said storage means on the basis of the transmission power per bit and said transmission power control information.

20. A mobile communication equipment as set forth in claim 19, wherein said address generating means is constructed to generate said address by addition of said transmission power per bit and said transmission power control information.

21. A mobile communication equipment as set forth in claim 20, wherein said address generating means derives the transmission power per bit by addition of an instantaneous transmission power and an average value of the transmission power.

22. A mobile communication equipment, comprising:
   a receiver receiving a signal from a communication counterpart, said signal containing a transmission power control information;
   a transmission equipment comprising a transmitter including component which causing non-linear distortion, a non-linear distortion compensation circuit in a transmission equipment for controlling a transmission power depending upon said transmission power control information upon transmission of a digital signal, including compensation component generating means for generating a compensation component for a non-linear distortion depending upon a transmission power per bit of said digital signal and said transmission power control information, and compensating means for compensating said non-linear distortion of the transmission signal by said compensation component, wherein said compensation component generating means comprises storage means for preliminarily storing a compensation data as said compensation component and address generating means for generating an address of said storage means on the basis of the transmission power per bit and said transmission power control information, wherein said address generating means is constructed to generate said address by addition of said transmission power per bit and said transmission power control information, wherein said address generating means derives the transmission power per bit by addition of an instantaneous transmission power and an average value of the transmission power, and wherein said transmission signal is a time slot type, said external transmission power control information is set for controlling the transmission power per transmission time slot, said address generating means derives said transmission power per bit by addition of an average power value of a transmission time slot at a certain timing and an instantaneous power value per each bit of subsequent transmission time slot.

23. A mobile communication equipment as set forth in claim 22, wherein said transmission power control information is information for transmission power control for subsequent transmission time slot.

24. A mobile communication equipment comprising:

a receiver configured to receive a signal from a communication counterpart, said signal containing a transmission power control information;

transmission equipment comprising:

a transmitter which includes a component that causes non-linear distortion of a signal-to-be-transmitted;

a non-linear distortion compensation circuit that is configured to control a transmission power of the signal-to-be-transmitted depending upon said transmission power control information upon transmission of a digital signal;

a compensation component generating unit configured to generate a compensation component for the component which causes the non-linear distortion, based upon a transmission power per bit of said digital signal and said transmission power control information; and a compensating unit configured to compensate said non-linear distortion of said signal-to-be-transmitted based on said compensation component, wherein said transmission signal is a time slot type, said external transmission power control information is set for controlling the transmission power per transmission time slot based on a reception time slot at a certain timing, said address generating means derives said transmission power per bit by addition of an average power value of a transmission time slot at the certain timing and an instantaneous power value per each bit of a subsequent transmission time slot.

* * * * *